United States Patent
Park et al.

(10) Patent No.: US 10,229,954 B2
(45) Date of Patent: Mar. 12, 2019

(54) ORGANIC LIGHT-EMITTING DEVICE AND ORGANIC LIGHT-EMITTING DISPLAY DEVICE USING THE SAME

(71) Applicant: LG Display Co., Ltd., Seoul (KR)

(72) Inventors: Eun-Jung Park, Goyang-si (KR); Kwan-Soo Kim, Paju-si (KR); Han-Byeol Seok, Seoul (KR); Seok-Hyun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/794,395

(22) Filed: Oct. 26, 2017

(65) Prior Publication Data

US 2018/0122870 A1 May 3, 2018

(30) Foreign Application Priority Data

Oct. 31, 2016 (KR) .................... 10-2016-0144049

(51) Int. Cl.
*H01L 27/32* (2006.01)
*H01L 51/50* (2006.01)
*H01L 51/52* (2006.01)

(52) U.S. Cl.
CPC ...... *H01L 27/3211* (2013.01); *H01L 27/3248* (2013.01); *H01L 51/5004* (2013.01); *H01L 51/5044* (2013.01); *H01L 51/5206* (2013.01); *H01L 2251/552* (2013.01)

(58) Field of Classification Search
CPC ............ H01L 27/3211; H01L 51/5044; H01L 27/3248; H01L 51/5206; H01L 51/5004; H01L 2251/552
See application file for complete search history.

(56) References Cited

U.S. PATENT DOCUMENTS

| | | | | |
|---|---|---|---|---|
| 2008/0284324 A1* | 11/2008 | Chun | ................. | H01L 27/3211 313/504 |
| 2014/0077177 A1* | 3/2014 | Hack | ................. | H01L 51/5044 257/40 |
| 2014/0077688 A1* | 3/2014 | Weaver | ............... | H01L 51/5004 313/504 |
| 2014/0183493 A1* | 7/2014 | Lee | ........................ | H01L 51/56 257/40 |

(Continued)

*Primary Examiner* — Victor A Mandala
(74) *Attorney, Agent, or Firm* — Morgan, Lewis & Bockius LLP

(57) ABSTRACT

An organic light-emitting device, including: a substrate including a blue sub-pixel, a green sub-pixel, and a red sub-pixel, each blue sub-pixel, green sub-pixel, and red sub-pixel respectively including an anode, a first common layer, a second common layer, and a cathode, in the blue sub-pixel, a blue light-emitting layer between the first common layer and the second common layer, in the green sub-pixel, a green light-emitting layer between the first common layer and the second common layer, and in the red sub-pixel, a red light-emitting layer between the first common layer and the second common layer, wherein HOMO energy levels of the blue, green, and red light-emitting layers are each lower than a HOMO energy level of the first common layer, and wherein the HOMO energy level of the green light-emitting layer is 0.2 eV or more higher than the HOMO energy level of the blue light-emitting layer.

14 Claims, 15 Drawing Sheets

(56) References Cited

U.S. PATENT DOCUMENTS

| | | | | |
|---|---|---|---|---|
| 2014/0209870 A1* | 7/2014 | Shim | ............... | H01L 51/5036 |
| | | | | 257/40 |
| 2014/0291631 A1* | 10/2014 | Lee | ............... | H01L 51/508 |
| | | | | 257/40 |
| 2015/0188087 A1* | 7/2015 | Lee | ............... | H01L 51/5265 |
| | | | | 257/40 |
| 2015/0340410 A1* | 11/2015 | Hack | ............... | H01L 51/5265 |
| | | | | 257/40 |
| 2016/0056401 A1* | 2/2016 | Lee | ............... | H01L 51/5016 |
| | | | | 257/40 |
| 2016/0155977 A1* | 6/2016 | Kim | ............... | H01L 51/5016 |
| | | | | 257/40 |

* cited by examiner $\triangle Eb\ (eV) = \triangle Eg\ (eV)$ $$\Delta E\ g\ (eV) = \Delta E\ r(eV)$$

$\triangle Eb\ (eV) = \triangle Eg\ (eV)$ $$\triangle Eg\,(eV) > \triangle Er(eV)$$

ORGANIC LIGHT-EMITTING DEVICE AND ORGANIC LIGHT-EMITTING DISPLAY DEVICE USING THE SAME

CROSS-REFERENCE TO RELATED APPLICATIONS

This application claims the priority of Korean Application No. 10-2016-0144049, filed on Oct. 31, 2016, the entirety of which is hereby incorporated by reference.

BACKGROUND

1. Technical Field

The present disclosure relates to an organic light-emitting device, and more particularly, to an organic light-emitting device having improved lifetime due to a relationship between color light-emitting layers and an adjacent common layer, and an organic light-emitting display device using the same.

2. Discussion of the Related Art

As the information age has arrived, the field of displays visually expressing electrical information signals has rapidly developed. To satisfy such a trend, various flat display devices, having excellent performance, e.g., thinness, light weight and low power consumption, have been researched as a substitute for a conventional cathode ray tube (CRT) display device.

As representative examples of flat display devices, there are liquid crystal displays (LCDs), plasma display panels (PDPs), field emission displays (FEDs), organic light-emitting device (OLED) displays, etc. Among these, an OLED display requires no separate light source, and has been considered to be competitive to achieve compactness and good color reproduction.

The organic light-emitting display includes a plurality of sub-pixels, and each sub-pixel includes an organic light-emitting device (OLED). The term "OLED" may also be used to refer to an "organic light-emitting diode." OLEDs are independently driven on a sub-pixel basis, including an anode and a cathode, and a plurality of organic layers between the anode and the cathode. The organic light-emitting device is used for a lighting and a display, including a flexible display device and a transparent display device, because the organic light-emitting device does not require an additional light source.

At least one layer of the organic layers between the anode and the cathode is an organic light-emitting layer. Holes and electrons from the anode and cathode are injected into the organic light-emitting layer, and are combined with each other in the organic light-emitting layer, thus generating excitons. When the generated excitons are changed from an excited state to a ground state, the organic light-emitting device emits light at the sub-pixels.

In the organic light-emitting device, an efficiency of light emission is determined according to a coupling efficiency of holes and electrons in the light-emitting layer. An organic light-emitting display device may be classified into two types. A first type of organic light-emitting display device has an organic light-emitting device including a different color light-emitting layer at each sub-pixel. A second type of organic light-emitting display device has an organic light-emitting device including a common white light-emitting layer over all sub-pixels and a different color filter on the organic light-emitting device at each sub-pixel.

In the first type of organic light-emitting display device, the different color light-emitting layers have different resonance condition according to their wavelength. Thus, the most suitable positions of emission between the anode and the cathode are different according to their emitting color in the light-emitting layer. Therefore, a sub-hole transport layer can be further applied to control the position of emission on the anode, beside the hole transport layer. Further, the sub-hole transport layer may have different thicknesses according to wavelengths of the light-emitting layers.

However, the sub-hole transport layer requires an additional deposition mask, and has lower yields. Therefore, the organic light-emitting display device having the sub-hole transport layer is not useful for a large area.

Also, when a plurality of stacks, which include the same color light-emitting layer in each stack for emission efficiency, are used in the organic light-emitting device, sub-hole transport layers having different thicknesses should be applied according to sub-pixels which emit different colors. In this case, forming organic light-emitting layers requires the number of deposition masks to be the number of stacks times the number of sub-pixels emitting different colors. That is, to realize the structure required for the optical distance adjustment with a plurality of stacks, an increase in the number of deposition masks necessarily results in a large yields loss, making mass production difficult.

SUMMARY

Accordingly, the present disclosure is directed to an organic light-emitting device and an organic light-emitting display device using the same that substantially obviate one or more of the issues due to limitations and disadvantages of the related art.

In one aspect, embodiments of the present disclosure may provide an organic light-emitting device having improved lifetime due to a relationship between color light-emitting layers and an adjacent common layer, and an organic light-emitting display device using the same.

In another aspect, embodiments of the present disclosure may provide a bandgap characteristic between different color light-emitting layers and the adjacent common layer in a structure in which optical distances are obtained by varying the thicknesses of the different color light-emitting layers without an auxiliary hole transport layer to increase efficiencies and product lifetime. In particular, highest occupied molecular orbital (HOMO) energy level differences between respective light-emitting layers and the adjacent common layer are determined.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting device, including: a substrate including a blue sub-pixel, a green sub-pixel, and a red sub-pixel, each blue sub-pixel, green sub-pixel, and red sub-pixel respectively including an anode, a first common layer, a second common layer, and a cathode, in the blue sub-pixel, a blue light-emitting layer between the first common layer and the second common layer, in the green sub-pixel, a green light-emitting layer between the first common layer and the second common layer, and in the red sub-pixel, a red light-emitting layer between the first common layer and the second common layer, wherein HOMO energy levels of the blue, green, and red light-emitting layers are each lower than a HOMO energy level of the first common layer, and wherein the HOMO energy level of the green light-emitting layer is 0.2 eV or more higher than the HOMO energy level of the blue light-emitting layer.

In another aspect, there is provided an organic light-emitting device, including: a substrate comprising a blue sub-pixel, a green sub-pixel, and a red sub-pixel, each sub-pixel comprising: a transistor; a stack in an order of: an anode connected to the transistor, a first common layer, a second common layer, and a cathode; in the blue sub-pixel, a blue light-emitting layer between the first common layer and the second common layer; in the green sub-pixel, a green light-emitting layer between the first common layer and the second common layer; and in the red sub-pixel, a red light-emitting layer between the first common layer and the second common layer, wherein HOMO energy levels of the blue, green, and red light-emitting layers are each lower than a HOMO energy level of the first common layer, and wherein the HOMO energy level of the green light-emitting layer is 0.2 eV or more higher than the HOMO energy level of the blue light-emitting layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
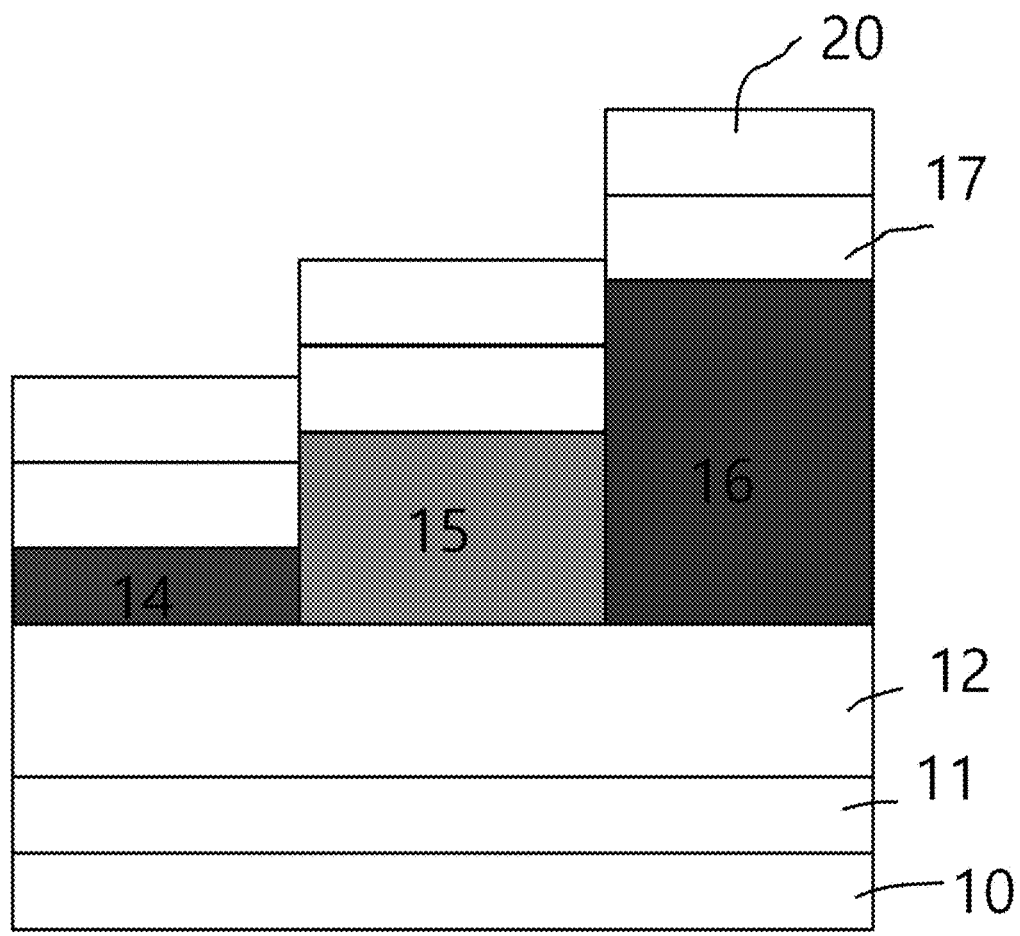
FIG. 1 is a cross-sectional view illustrating an organic light-emitting device according to a first example type of an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

In the present disclosure, the "lowest unoccupied molecular orbital (LUMO) energy level" and the "highest occupied molecular orbital (HOMO) energy level" of any layer indicate the LUMO energy level and the HOMO energy level of a material that occupies the greatest weight percentage of the corresponding layer, for example, a host material, and does not refer to the LUMO energy level and the HOMO energy level of a dopant material doped on the corresponding layer unless otherwise mentioned.

In the present disclosure, the "HOMO energy level" may be the energy level measured by cyclic voltammetry (CV) that determines the energy level from a potential value relative to a reference electrode, the potential value of which is known. For example, the HOMO energy level of any material may be measured using ferrocene, the oxidation potential value and the reduction potential value of which are known, as a reference electrode.

In the present disclosure, the term "doped" indicates that the material that occupies the greatest weight percentage of any layer is added with a material that has a different physical property (for example, an N-type or P-type or an organic material or an inorganic material) from that of the material that occupies the greatest weight percentage in an amount corresponding to a weight percentage less than 15%. In other words, a "doped" layer indicates a layer, the host material and the dopant material of which may be distinguished from each other based on the weight percentages thereof. In addition, the term "undoped" refers to all cases excluding the case corresponding to the term "doped." For example, when any layer is formed of a single material or is formed of a mixture of materials having the same or similar properties, the layer belongs to the "undoped" layer. For example, when at least one constituent material of any layer is of a P-type and all other constituent materials of the layer are not of an N-type, the layer belongs to the "undoped" layer. For example, when at least one constituent material of any layer is an organic material and all other constituent materials of the layer are not an inorganic material, the layer belongs to the "undoped" layer. For example, when any layer is mainly formed of organic materials, at least one material of the layer is of an N-type and at least one other material of the layer is of a P-type, the layer belongs to the "doped" layer when the weight percentage of the N-type material is less than 15% or the weight percentage of the P-type material is less than 15%.

In the present disclosure, the term "stack" refers to a unit structure that includes organic layers, such as a hole transport layer (HTL) and an electron transport layer (ETL), and an organic light-emitting layer interposed between the hole transport layer and the electron transport layer. The organic layers may further include a hole injection layer, an electron blocking layer, a hole blocking layer, and an electron injection layer, and may further include other organic layers according to the structure or design of the organic light-emitting element.

The organic light-emitting device of embodiments of the present disclosure provides a bandgap characteristic between different color light-emitting layers and the adjacent common layer in the structure in which optical distances are obtained by varying the thicknesses of the different color light-emitting layers without an auxiliary hole transport layer to increase efficiencies and product lifetime. In particular, HOMO level differences between respective light-emitting layers and the adjacent common layer are determined.

FIG. 1 is a cross-sectional view illustrating an organic light-emitting device according to a first example type of an embodiment of the present disclosure.

As shown in the FIG. 1 example, an organic light-emitting device according to the first example type of an embodiment of the present disclosure relates to a single stack between an anode 10 and a cathode 20. That is, each single stack may be provided for a red sub-pixel, a green sub-pixel, and a blue sub-pixel. In each sub-pixel, the organic light-emitting device may include the anode 10 and the cathode, and a hole injection layer 11. The organic light-emitting device may further include a hole transport layer 12, a light-emitting layer 14 or 15 or 16, and an electron transport layer 17, in this order between the anode 10 and the cathode 20.

In one example, only the light-emitting layers 14, 15, and 16, among the organic layers between the anode 10 and the cathode 20, may have different thicknesses for each sub-pixel. The other layers may be commonly provided for all sub-pixels. Thus, the other layers may be referred to as "common layers."

Although the anode 10 is illustrated as being formed integrally in three sub-pixels in FIG. 1, embodiments are not limited thereto. For example, the anode 10 can be separately formed for each sub-pixel. In one example, when a current is applied between the anode 10 and the cathode 20 at each sub-pixel, an electrical field may be formed between the anode 10 and the cathode 20, and individual light emission may be performed for each sub-pixel.

Meanwhile, the light-emitting layers 14, 15, and 16 may have different thicknesses in each sub-pixel, and an emission region may be differently generated by varying optical distance according to wavelength of emitting color in each light-emitting layer. If there are a blue sub-pixel, a green sub-pixel, and a red sub-pixel, the red light-emitting layer 16 may be thicker than the green light-emitting layer 15, and the green light-emitting layer 15 may be thicker than the blue light-emitting layer 14. For example, the thicknesses of the blue light-emitting layer 14, the green light-emitting layer 15, and the red light-emitting layer 16 may be, e.g., 200 Å, 400 Å, and 650 Å, respectively. Thickness difference of the light-emitting layers between adjacent sub-pixels can be, e.g., 150 Å to 300 Å.

The first example type of embodiment of the present disclosure may provide an optimum optical distance of emission region in each color with only the respective thickness of the light-emitting layer, without an auxiliary common layer. In this case, the first example type of embodiment of the present disclosure may further define the difference of the HOMO energy levels between the light-emitting layer and the hole transport layer that is adjacent to the light-emitting layer and commonly positioned in contact with the light-emitting layers, in addition to providing different thicknesses of the light-emitting layers according to their wavelengths to increase produce lifetime and efficiencies. Meanwhile, the particular difference of the HOMO energy levels between the light-emitting layer and the hole transport layer will be described later with reference to FIGS. 3 to 11.

Figure 2:
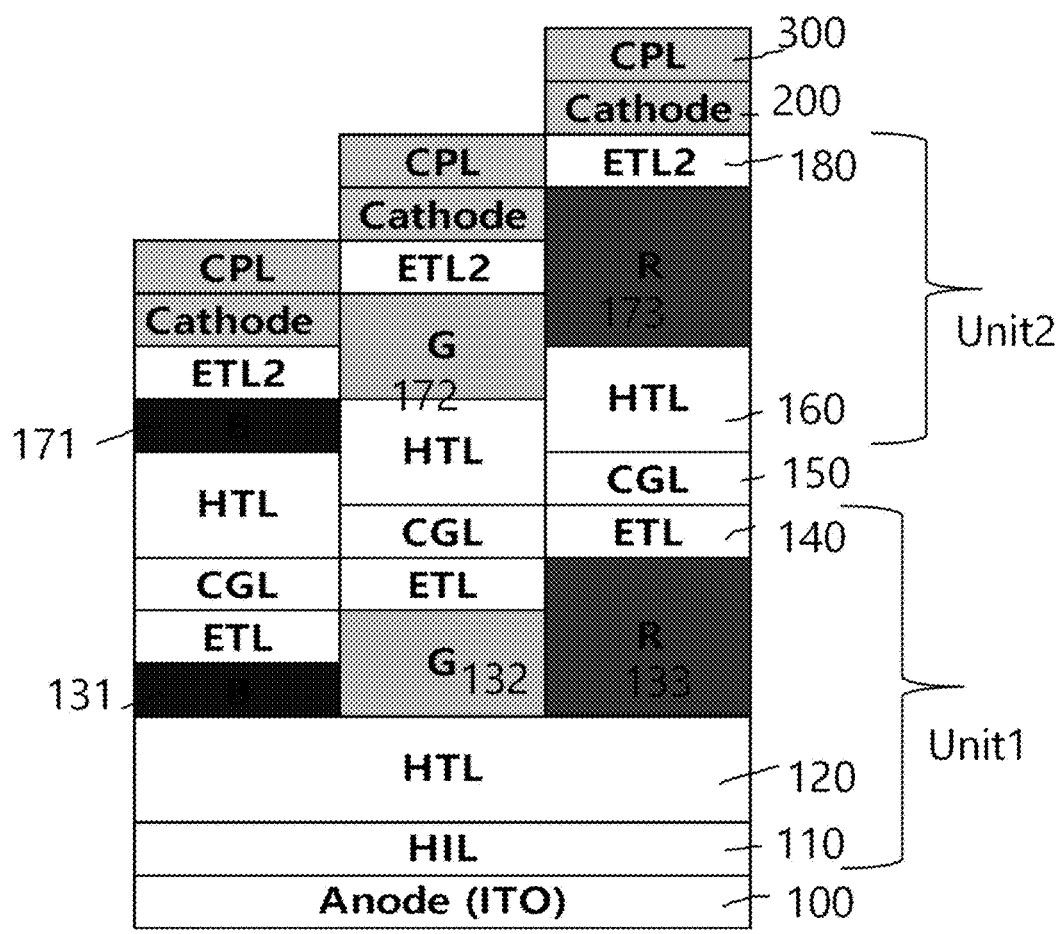
FIG. 2 is a cross-sectional view illustrating an organic light-emitting device according to a second example type of an embodiment of the present disclosure.

FIG. 2 is a cross-sectional view illustrating an organic light-emitting device according to a second example type of embodiment of the present disclosure.

As shown in the FIG. 2 example, the organic light-emitting device according to the second example type of embodiment of the present disclosure may include a plurality of units between an anode 100 and a cathode 200. It is possible to include two units between the anode 100 and the cathode 200, as shown in FIG. 2, or even three or more units between the anode 100 and the cathode 200.

A first common layer 120 or 160, a light-emitting layer 131/132/133 or 171/172/173 and a second common layer 140 or 180 may be stacked as a basic structure for each sub-pixel, and there may be a charge generation layer (CGL) 150 between two units. For example, a first blue light-emitting layer 131 and a second blue light-emitting layer 171 that emit the same blue color may be positioned in different units (e.g., Unit1 and Unit2) at the blue sub-pixel. Similarly, a first green light-emitting layer 132 and a second green light-emitting layer 172 that emit the same green color may be positioned in different units (e.g., Unit1 and Unit2) at the green sub-pixel; and a first red light-emitting layer 133 and a second red light-emitting layer 173 that emit the same red color may be positioned in different units (e.g., Unit1 and Unit2) at the red sub-pixel.

The charge generation layer 150 may be a single layer or may be two layers, including an n-type charge generation layer and a p-type charge generation layer. If there are two layers, the n-type charge generation layer may contact the electron transport layer of the lower unit, and the p-type charge generation layer may contact the hole transport layer of the upper unit. The electron transport layer may be the second common layer of the lower unit, and the hole transport layer may be the first common layer of the upper unit.

For example, the organic light-emitting device according to the second example type of embodiment of the present disclosure may include a substrate including a blue sub-pixel, a green sub-pixel, and a red sub-pixel (see, e.g., reference number "50" in the FIG. 12 example), an anode 100 at each sub-pixel on the substrate 50, a cathode 200 opposing the anode 100, a plurality of units Unit1, Unit2 between the anode 100 and the cathode 200, and a charge generation layer 150 between the two adjacent units Unit1, Unit2. In each unit Unit1, Unit2, there may be, commonly, a first common layer 120 or 160 and a second common layer 140 or 180.

Further, the first blue light-emitting layer 131 may be provided between the first common layer 120 and the second common layer 140 in the first unit Unit1 at the blue sub-pixel. The first green light-emitting layer 132 may be provided between the first common layer 120 and the second common layer 140 in the first unit Unit1 at the green sub-pixel. The first red light-emitting layer 133 may be provided between the first common layer 120 and the second common layer 140 in the first unit Unit1 at the red sub-pixel.

In a same manner, the second blue light-emitting layer 171 may be provided between the first common layer 160 and the second common layer 180 in the second unit Unit2 at the blue sub-pixel. The first green light-emitting layer 172 may be provided between the first common layer 160 and the second common layer 180 in the second unit Unit2 at the green sub-pixel. The first red light-emitting layer 173 may be provided between the first common layer 160 and the second common layer 180 in the second unit Unit2 at the red sub-pixel.

In the organic light-emitting device according to the second example type of embodiment of the present disclosure, the first and second common layers 120, 140, 160, 180 between the anode 100 and the cathode 200, except the light-emitting layers 131, 132, 133, 171, 172, 173, may be commonly provided over all sub-pixels. That is, the first and second common layers 120, 140, 160, 180 can be formed without a deposition mask.

In the example of FIG. 2, the first common layers 120 and 160 may be hole transport layers and the second common layers 140 and 180 may be electron transport layers. In some cases, at least one of the first common layer and the second common layer can include a plurality of layers.

Also, as shown in the FIG. 2 example, a hole injection layer (HIL) 110 may be further provided between the anode 100 and the first common layer 120 of the lower unit Unit1. Further, an electron injection layer (not shown) may be further provided between the cathode 200 and the second common layer 180 of the upper unit Unit2. In some cases, the electron injection layer may include inorganic materials. Thus, the electron injection layer may be formed together with the forming of the cathode, which may be of a metal that is an inorganic material.

Also, the hole transport layer 110 and the electron injection layer can be selectively respectively provided in each stack, or in only one stack. For example, the hole transport layer 110 can be in contact with the anode 100, and the electron injection layer can be in contact with the cathode 200.

Meanwhile, each emission region may be defined within the light-emitting layer in the organic light-emitting device. By varying the thickness of the light-emitting layer, each emission region can be controlled within each light-emitting layer. In a particular light-emitting layer, the emission layer can be positioned at a part of the light-emitting layer, not for an entire thickness of the light-emitting layer.

The blue light-emitting layer 131 may have an optimum optical distance at the lowest position between the anode 100 and the cathode 200 in view of its color wavelength characteristic. The green light-emitting layer 132 may have an optimum optical distance at the higher position than the optimum optical distance of the blue light-emitting layer 131. The red light-emitting layer 133 may have an optimum optical distance at the highest position, which is higher than the optimum optical distances of the blue and green light-emitting layers 131, 132. The respective light-emitting layers may be thicker in an order of the blue light-emitting layer 131, the green light-emitting layer 132, and the red light-emitting layer 133 because the optimum optical distance is formed in the corresponding light-emitting layer. That is, the blue light-emitting layer 131 may be the thinnest, and the red light-emitting layer 133 may be the thickest among the light-emitting layers. For example, the blue light-emitting layer 131, the green light-emitting layer 132, and the red light-emitting layer 133 may have respective thicknesses of 200 Å, 400 Å and 650 Å. The thickness difference between horizontally adjacent light-emitting layers 131 and 132, or 132 and 133, or 133 and 131 may be, e.g., 150 Å to 300 Å.

A step difference of upper surfaces between horizontally adjacent light-emitting layers 171 and 172, or 172 and 173, or 173 and 171 in the second (or upper) unit Unit2 may be 300 Å to 450 Å because the second light-emitting layer 171, 172, 173 of the upper unit Unit2 may be formed on the first common layer 160, which may have the step difference of the first (or lower) unit Unit1. Also, a capping layer 300 (CPL) (see also FIG. 12) may be included to protect the organic light-emitting device on the substrate.

Figure 3:
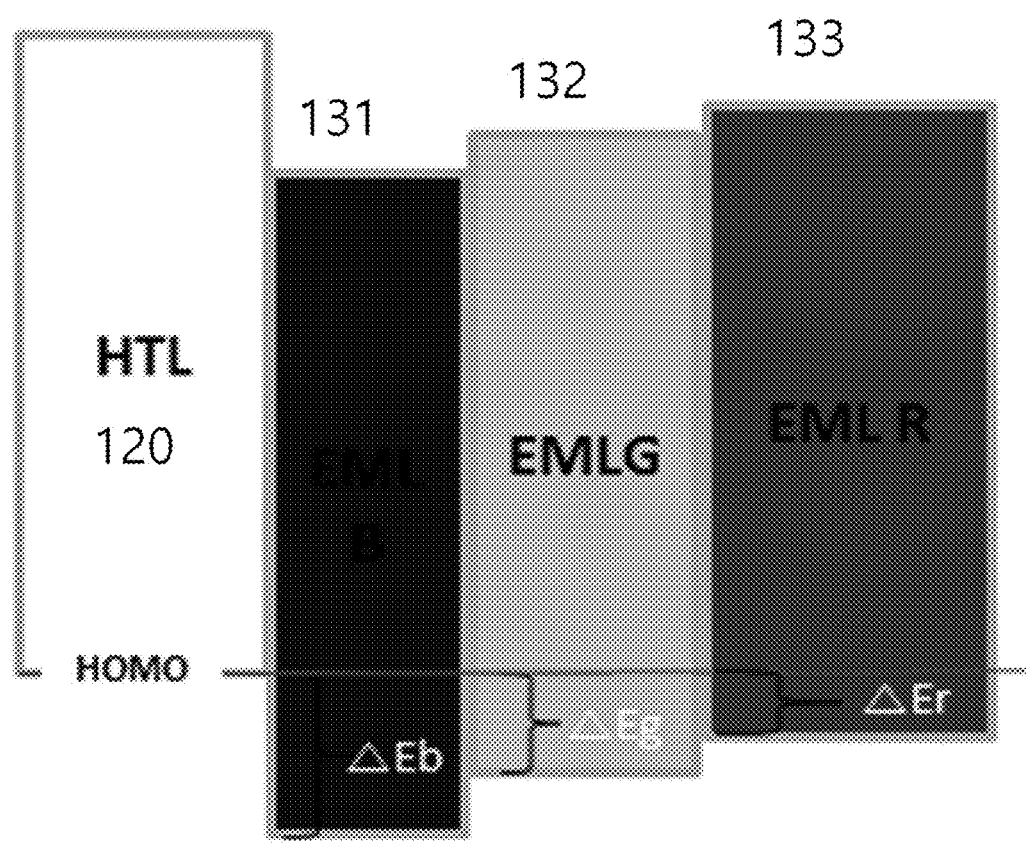
FIG. 3 is a band diagram for different color light-emitting layers and an adjacent common layer of FIG. 1.

FIG. 3 is a band diagram for different color light-emitting layers and an adjacent common layer of FIG. 1.

The organic light-emitting devices according to the first example type in FIG. 1 and the second example type in FIG. 2 of embodiments of the present disclosure shows a bandgap characteristic between the light-emitting layers and the adjacent common layer according to FIG. 3.

The HOMO energy levels of the blue, green, and red light-emitting layers 131, 132, 133 are each lower than an HOMO energy level of the first common layer 120. The HOMO energy level of the green light-emitting layer (EMLG) 132 is 0.2 eV or more higher than the HOMO energy level of the blue light-emitting layer (EMLB) 131. This may be expressed as Equation 1 below:

$$|\Delta Eb - \Delta Eg| \geq 0.2 \text{ eV} \qquad (1)$$

In this case, ΔEb is a HOMO difference between the first common layer 120 and the blue light-emitting layer, and ΔEg is a HOMO difference between the first common layer 120 and the green light-emitting layer. The HOMO energy level of the red light-emitting layer (EMLR) 133 is 0.2 eV or more higher than the HOMO energy level of the green light-emitting layer 132. For example, it is effective, not only when there is a sequential HOMO difference of each difference 0.2 eV or more among the blue, green, and red sub-pixels, but also when there is a HOMO energy level difference 0.2 eV or more between the two light-emitting layers that are horizontally adjacent each other.

In the organic light-emitting device, the HOMO energy levels of the blue, green, and red light-emitting layers 131, 132, 133 are each lower than an HOMO energy level of the first common layer 120 in an order such that HOMO blue<HOMO green<HOMO red. As such, holes through the first common layer 120 can be easily moved to the light-emitting layers 131, 132, and 133 without an energy barrier.

The blue light-emitting layer 131, the green light-emitting layer 132, and the red light-emitting layer 133 may be horizontally positioned in each sub-pixel, and the light-emitting layers 131, 132, 133 may all contact the first common layer 120. In one example, if there is a particular energy gap ΔE between a light-emitting layer 131, 132, 133 and the first common layer 120, the HOMO energy level of the first common layer 120 may be higher than that of the light-emitting layer to easily transport holes from the first common layer 120 to the light-emitting layers 131 or 132 or 133. Because the blue light-emitting layer 131 may be the thinnest among light-emitting layers of the blue, green, and red sub-pixels, the entire thickness of the blue light-emitting layer 131 can be referred to as an emission region. In one example, if the HOMO energy level difference ΔEb between the blue light-emitting layer and the first common layer 120 is increased, supply of holes to the blue light-emitting layer 131 at the blue sub-pixel may be fastest among the blue, green, and red sub-pixels as arranged horizontally.

Furthermore, the HOMO energy level of the green light-emitting layer 132 may be 0.2 eV or more higher than the HOMO energy level of the blue light-emitting layer 131 (e.g., |ΔEb−ΔEg|≥0.2 eV), so that the supplying of holes from the first common layer 120 into the green light-emitting layer 132 may be performed later than the supplying of holes from the first common layer 120 into the blue light-emitting layer 131. Therefore, the velocity difference of the supplying of holes may cause an emission region of the green light-emitting layer 132, resulting from recombining the electrons from the cathode and the holes from the first common layer 120 in the green light-emitting layer 132, to be positioned higher than an emission region of the blue light-emitting layer 131.

In a similar manner, the HOMO energy level of the red light-emitting layer 133 may be 0.2 eV or more higher than the HOMO energy level of the green light-emitting layer 131 (e.g., |ΔEg−ΔEr|≥0.2 eV), so that the supplying of holes from the first common layer 120 into the red light-emitting layer 133 may be performed later than the supplying of holes from the first common layer 120 into the blue and green light-emitting layers 131, 132. This may be expressed as Equation 2 below:

$$|\Delta Eg - \Delta Er| \geq 0.2 \text{ eV} \quad (2)$$

In this case, ΔEb is a HOMO difference between the first common layer 120 and the blue light-emitting layer, and ΔEr is a HOMO difference between the first common layer 120 and the red light-emitting layer.

Therefore, the velocity difference of the supplying of holes may cause an emission region of the red light-emitting layer 133, resulting from recombining the electrons from the cathode and the holes from the first common layer 120 in the red light-emitting layer 133, to be positioned higher than emission regions of the blue and green light-emitting layers 131, 132.

That is, the differences of thickness among the light-emitting layers 131, 132, 133 and the differences of the HOMO energy levels among the light-emitting layers 131, 132, 133 may cause different emission regions in each light-emitting layer 131, 132, 133. In addition, in the second unit Unit2, the HOMO energy levels of the light-emitting layers 171, 172, 173 may be defined in relation to the first common layer 160 in a similar manner as in the first unit Unit1.

In comparing the HOMO energy levels of the light-emitting layers and the first common layer in the present disclosure, the HOMO energy levels of the light-emitting layers and the first common layer may be compared to each other in view of the band diagrams as shown in FIGS. 3 to 8. If the HOMO energy levels of the light-emitting layers and the first common layer are compared with their respective absolute values, the HOMO energy level of first common layer 120 being higher than that of each light-emitting layer 131, 132, 133 means that the absolute value of the HOMO energy level of the first common layer 120 is less than the absolute value of each the HOMO energy level of the light-emitting layers 131, 132, 133. Similarly, the HOMO energy level of blue light-emitting layer 131 being lower than the HOMO energy level of each of the green and red light-emitting layers 132, 133 means that the absolute value of the HOMO energy level of the blue light-emitting layer 131 is greater than the absolute value of each HOMO energy level of the light-emitting layers 132, 133. The HOMO energy levels and the LUMO energy levels of layers can be determined relative to a vacuum level.

In FIG. 3, the blue, green, and red light-emitting layers 131, 132, 133 may be positioned in parallel on the first common layer 120. Each light-emitting layer 131, 132, 133 may be horizontally adjacent each other, and may be vertically in contact with the first common layer 120.

The organic light-emitting device of embodiments may not require an auxiliary hole transport layer, but may have different color light-emitting layers 131, 132, 133 having different thicknesses to define different optimum optical distances in blue, green, and red sub-pixels. In addition, to have charge balance between hole and electrons, the blue, green, and red light-emitting layers may have respective differences of HOMO energy levels, with the first common layer 120 functioning as a hole transport layer. By such changes, an energy barrier in supplying of holes may be controlled according to a desired emission region. This may increase product lifetime and efficiencies of the device.

In the Figures, the bandgap is related to its host of the light-emitting layer 131, 132, 133. A difference of HOMO energy levels between adjacent light-emitting layers means that different hosts are used in the adjacent light-emitting layers. Further, a single host or a plurality of hosts may be used in each light-emitting layer. If a plurality of hosts is used in each light-emitting layer, all hosts may correspond to the HOMO energy level described in the FIG. 3 example.

Figure 4:
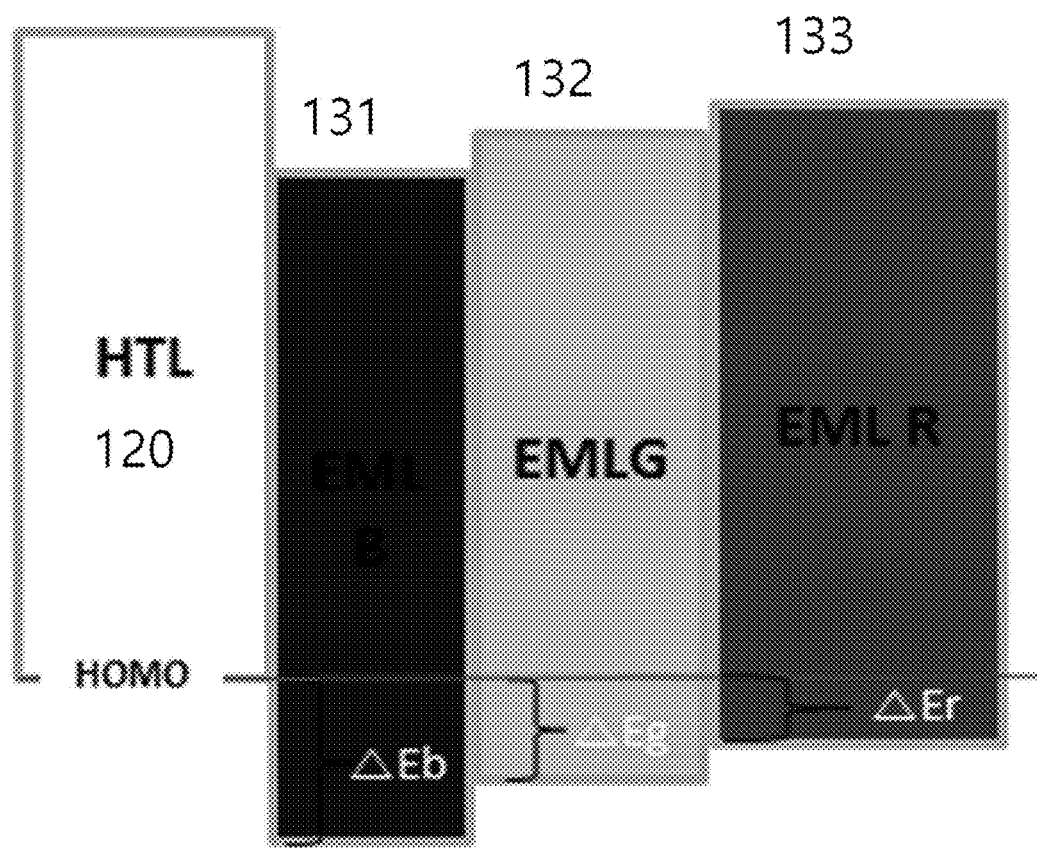
FIG. 4 is a band diagram for different color light-emitting layers and adjacent common layers of FIG. 2.

FIG. 4 is a band diagram for different color light-emitting layers and adjacent common layers of FIG. 2.

As shown in FIG. 4, in some embodiments, a hole control layer (HCL) 125 may be further provided between the first common layer 120 (hole transport layer) and the light-emitting layers 131, 132, 133. In one example, the hole control layer 125 may have a bandgap characteristic that is similar to, but lower than, the bandgap characteristic of the first common layer 120 (hole transport layer). That is, the LUMO energy level of the hole control layer 125 may be lower than the LUMO energy level of the hole transport layer 120, and the HOMO energy level of the hole control layer 125 may be lower than that the HOMO energy level of the hole transport layer 120. The hole control layer 125 may have a similar difference of HOMO levels with the adjacent light-emitting layers 131, 132, 133 as described above for the HOMO level of the hole transport layer 120.

In one example, the HOMO energy levels of the blue, green, and red light-emitting layers 131, 132, 133 may be lower than an HOMO energy level of the hole control layer 125. The HOMO energy level of the green light-emitting layer 132 may be 0.2 eV or more higher than the HOMO energy level of the blue light-emitting layer 131 (e.g., |ΔEb−ΔEg|≥0.2 eV, where ΔEb is a HOMO difference between the hole control layer 125 and the blue light-emitting layer, and ΔEg is a HOMO difference between the hole control layer 125 and the green light-emitting layer). Further, the HOMO energy level of the red light-emitting layer 133 is 0.2 eV or more higher than the HOMO energy level of the green light-emitting layer 132 (e.g., |ΔEg−ΔEr|≥0.2 eV, where ΔEr is a HOMO difference between the hole control layer 125 and the red light-emitting layer 133).

Among the light-emitting layers 131, 132, 133, the blue light-emitting layer 131 may be the thinnest, and the red light-emitting layer 133 may be the thickest. The thickness of the green emitting layer 132 may be between that of the blue light-emitting layer 131 and that of the red light-emitting layer 133. The blue light-emitting layer 131, the green light-emitting layer 132, and the red light-emitting layer 133 may each be in contact with the hole control layer 125.

The organic light-emitting device according to a second example embodiment of the present disclosure may have a configuration for other layers according to the configurations of the examples in FIGS. 1 to 3 described above, except for the hole control layer and light-emitting layer. Hereinafter, effects of the organic light-emitting device of the present disclosure are discussed based on experiments that have been performed.

In the reference examples and the experimental examples, the substrate has a red sub-pixel, a green sub-pixel, and a blue sub-pixel; and each sub-pixel is divided by having a bank at its boundary. Further, each organic light-emitting device in each sub-pixel has two units (stacks), including the charge generation layer of the FIG. 2 example. In the reference examples and the experimental examples, the same material is used for the blue light-emitting layer, and different materials may be used for the other light-emitting layers. In addition, a hole transport layer in the experiments is a first common layer as described above.

Figure 5A:
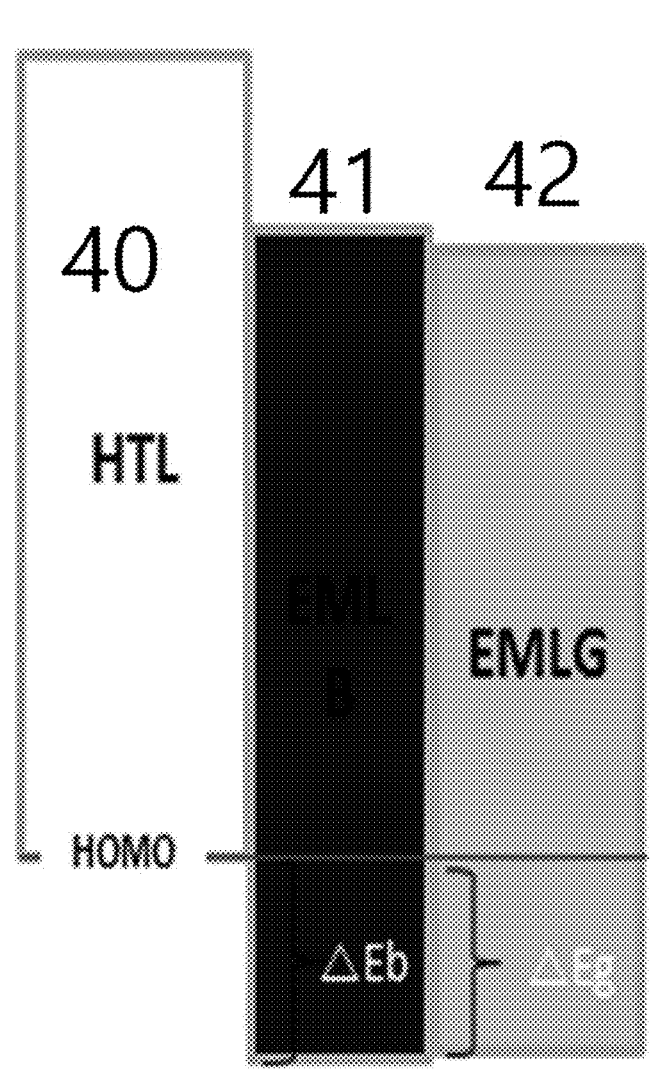
FIG. 5A to 5C are band diagrams for different color light-emitting layers and an adjacent common layer according to reference examples.
Figure 5B:
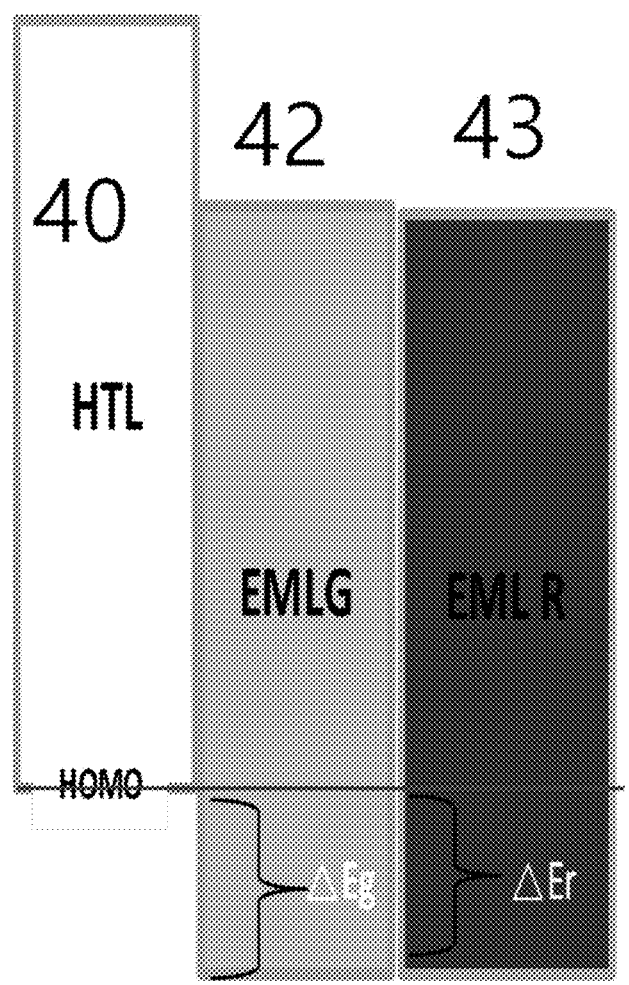
Figure 5C:
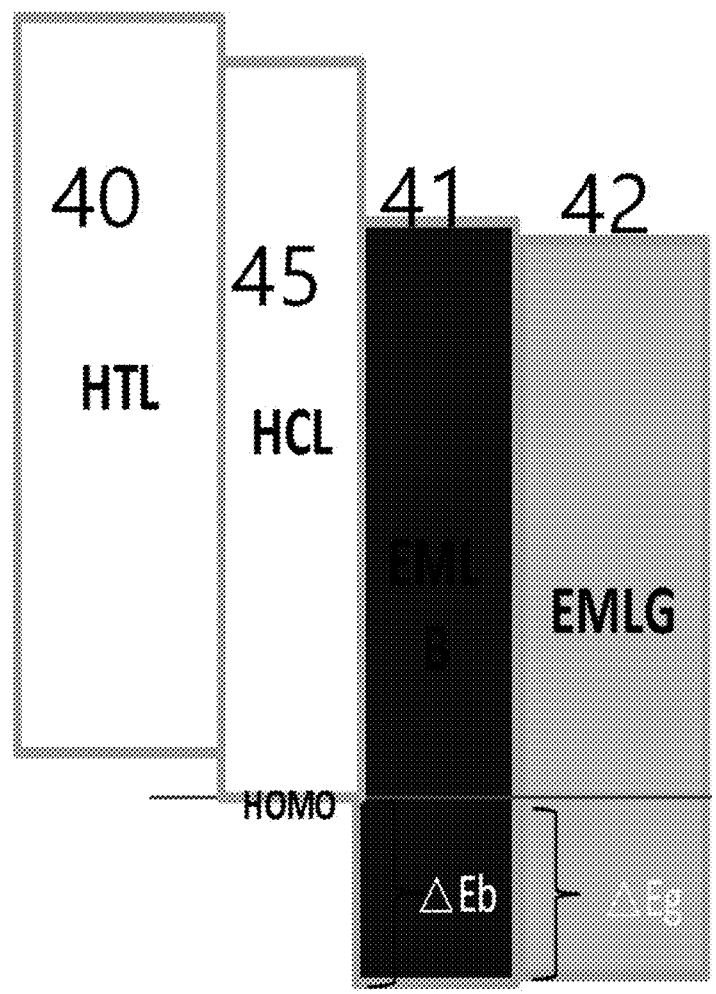

FIGS. 5A to 5C are band diagrams for different color light-emitting layers and an adjacent common layer according to reference examples.

As shown in FIGS. 5A to 5C, the light-emitting layers 41, 42, 43 have hosts representing the same or similar bandgaps in the reference examples.

FIG. 5A shows the first reference example. In the first reference example, the blue light-emitting layer 41 and the green light-emitting layer 42 have the same bandgap. That is, a HOMO difference (ΔEb) between the hole transport layer 40 and the blue light-emitting layer 41 is the same as a HOMO difference (ΔEg) between the hole transport layer 40 and the green light-emitting layer 42.

FIG. 5B shows the second reference example. In the second reference example, the green light-emitting layer 42 and the red light-emitting layer 43 have the same bandgap. That is, a HOMO difference (ΔEg) between the hole transport layer 40 and the green light-emitting layer 42 is the same as a HOMO difference (ΔEr) between the hole transport layer 40 and the red light-emitting layer 43.

FIG. 5C shows the third reference example. In the third reference example, the blue light-emitting layer 41 and the green light-emitting layer 42 have the same bandgap, and a hole control layer 45 is further provided between the hole transport layer and the light-emitting layers 41, 42.

In the first to third reference examples, the organic light-emitting device on the green sub-pixel is formed according to the following steps.

On the substrate, three layers of ITO (indium tin oxide) (70 Å)/APC (aluminum-lead-copper or Ag—Pd—Cu alloy) (70 Å)/ITO (70 Å) are laminated and patterned to form an anode 100. On the anode, 400 Å of NPD (e.g., N,N'-Di(1-naphthyl)-N,N'-diphenyl-(1,1'-biphenyl)-4,4'-diamine) is deposited to form a hole transport layer 40 of the first unit Unit1 in FIGS. 5A to 5C. The hole transport layer 40 corresponds to the first common layer 120 in FIG. 2. Herein, a p-type dopant, for example $TCNQF_4$ (tetrafluorotetracyanoquinodimethane) at 3 wt %, is doped with 50 Å thickness on an interface of the anode. This doped layer corresponds to the hole injection layer 110 in FIG. 2.

Subsequently, an anthracene derivative as a green host with a thickness of 400 Å is deposited by doping an anthracene derivative with a green dopant at 5 wt % to form a first light-emitting layer 42 on the hole transport layer 40 in the green sub-pixel. The HOMO energy level of the anthracene derivative as the green host is almost the same as the HOMO energy level of the blue host material in the blue light-emitting layer.

Then, an electron transport layer 140 is deposited with a thickness of 150 Å on the first light-emitting layer 42. Next, an n-type charge generation layer 150 is formed by depositing an anthracene derivative as a main material with a thickness of 150 Å and doping it with lithium (Li) at 1 wt %. Subsequently, a p-type charge generation layer 150 is formed with a thickness of 50 Å by depositing NPD and doping it with $TCNQF_4$ at 15 wt %.

Over the entire device, NPD is deposited with a thickness of 350 Å to form the hole transport layer 160 of the second unit Unit2. Then, an anthracene derivative as a green host with a thickness of 400 Å is deposited by doping an anthracene derivative at 5 wt % with a green dopant to form a second light-emitting layer 42 on the hole transport layer 40 in the green sub-pixel, similarly to the first unit Unit1. The hole transport layer 40 corresponds to the first common layer 160 in FIG. 2.

Next, an electron transport material and LiQ (8-Hydroxyquinolinolato-lithium) are codeposited in a ratio of 1:1 with a thickness of 300 Å to form an electron transport layer 180 on the second light-emitting layer 42. Subsequently, Mg:LiF (magnesium:lithium fluoride) in a ratio of 1:1 with a thickness of 30 Å and Ag:Mg (silver:magnesium) in a ratio of 3:1 with a thickness of 160 Å are sequentially deposited to form a cathode 200. Then, a capping layer 300 is formed by depositing NPD with a thickness of 650 Å.

In the reference and experimental examples, only light-emitting layers 41, 42, 43 are selectively in each sub-pixel. The other layers are commonly formed over entire sub-pixels.

In the first and third reference examples and the experimental examples according to example embodiments, the blue light-emitting layer 41 or 131 is formed with a thickness of 200 Å by depositing anthracene derivative as a blue host and doping blue dopant in the blue sub-pixel. The blue host and the green host in the first and the third reference examples have a HOMO energy level of −6.0 eV.

In the second reference example, the red light-emitting layer is formed with a thickness of 650 Å by depositing Be-complex (beryllium-complex) derivative as a red host and doping btp2Ir(acac) (bis(2-(2'-benzo[4,5-α]thienyl)

pyridinato-N,C3')iridium(acetylacetonate)) at 5 wt % as a red dopant in the red sub-pixel. In this case, the HOMO energy level of the red host is about −5.8 eV, which is almost the same as the HOMO energy level of the green host in the green light-emitting layer 42.

Figure 6A:
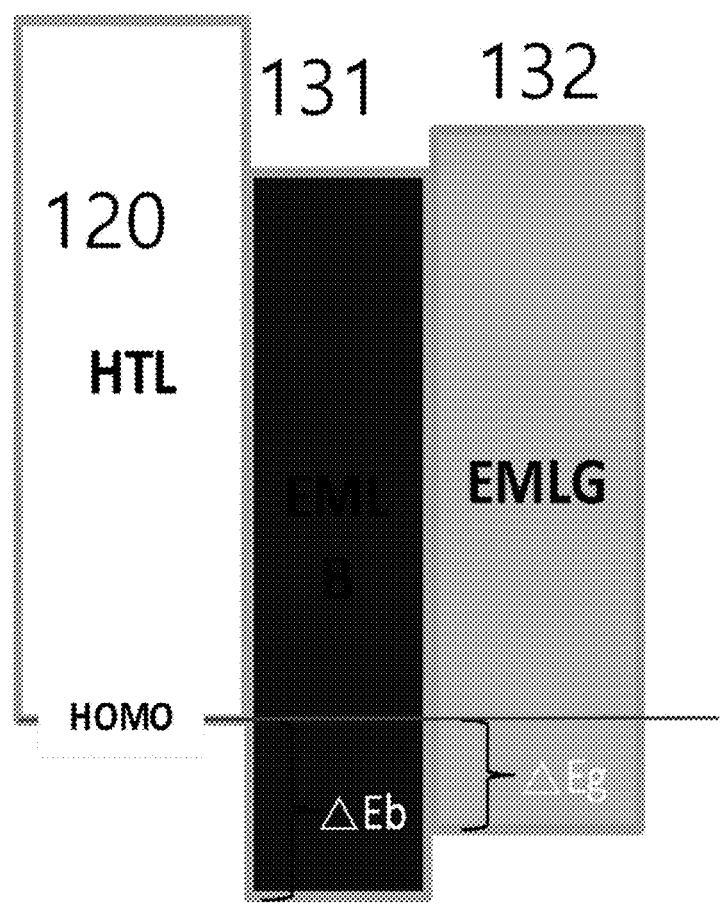
FIG. 6A is a band diagram for two different color light-emitting layers and an adjacent common layer according to a first example embodiment of the present disclosure.
Figure 6B:
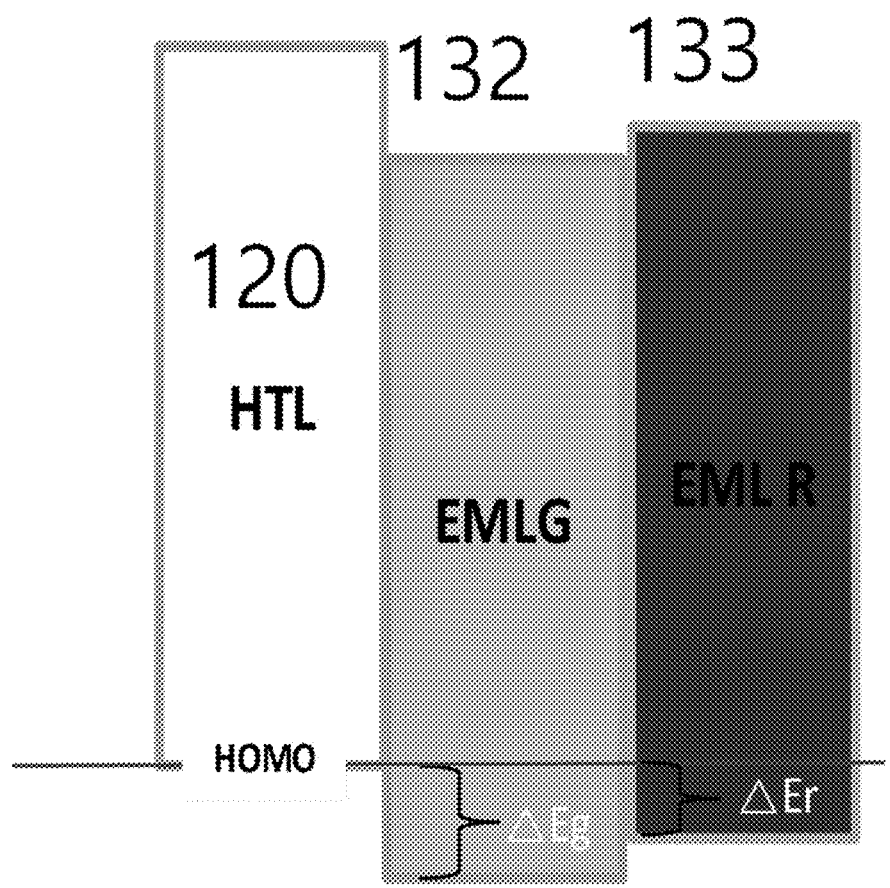
FIG. 6B is a band diagram for two different color light-emitting layers and an adjacent common layer according to a second example embodiment of the present disclosure.

FIG. 6A is a band diagram for two different color light-emitting layers and an adjacent common layer according to a first example embodiment of the present disclosure. FIG. 6B is a band diagram for two different color light-emitting layers and an adjacent common layer according to a second example embodiment of the present disclosure.

Figure 7:
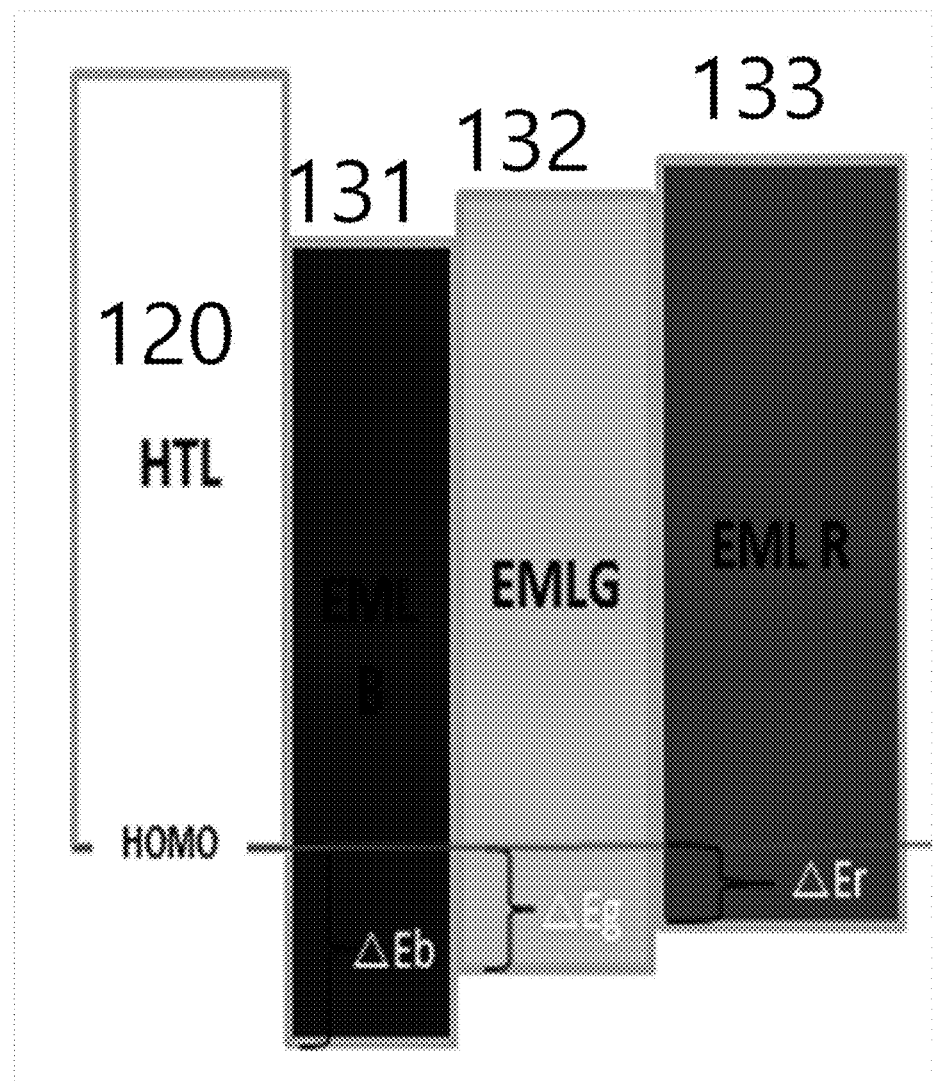
FIG. 7 is a band diagram for three different color light-emitting layers and an adjacent common layer according to a third example embodiment of the present disclosure.

FIG. 7 is a band diagram for three different color light-emitting layers and an adjacent common layer according to a third example embodiment of the present disclosure.

Table 1 shows the results of the first reference examples and an experimental example according to the first embodiment of the present disclosure. In Table 1, the first reference examples are experimented on by dividing the devices A, B, and C by differing their green hosts in the green light-emitting layer. The devices A, B, and C have green hosts that are different from each other, but the green hosts have the same HOMO energy level and the same LUMO energy level. The glass transition temperatures of the green hosts are different.

TABLE 1

| Device | Structure | | Doping ratio | Voltage (V) | Efficiency (Cd/A) | CIE_x | CIE_y | T95 (hours) | HOMO (eV) | LUMO (eV) |
|---|---|---|---|---|---|---|---|---|---|---|
| | GH | | | | | | | | | |
| A | First reference example_1 | | 3% | 8.7 | 12.2 | 0.285 | 0.691 | 80 | −6.0 | −3.0 |
| B | First reference example_2 | | 3% | 9.1 | 95.5 | 0.285 | 0.691 | 80 | −6.0 | −3.0 |
| C | First reference example_3 | | 3% | 8.5 | 118.7 | 0.285 | 0.691 | 100 | −6.0 | −3.0 |
| D | First embodiment | | 3% | 8.5 | 106.9 | 0.285 | 0.691 | 460 | −5.7 | −2.9 |

As shown in the FIG. 6A example, the blue light-emitting layer 131 and the green light-emitting layer 132 are in contact with the hole transport layer 120 in the first example embodiment of the present disclosure. As shown in the FIG. 6B example, the green light-emitting layer 132 and the red light-emitting layer 133 are in contact with the hole transport layer 120 in the second example embodiment of the present disclosure.

The organic light-emitting device of the first example embodiment of the present disclosure as shown in the example of FIG. 6A has a similar structure to that of the reference examples, except that the blue host of the blue light-emitting layer has a HOMO energy level of about −6.0 eV, and the green host of the green light-emitting has a HOMO energy level of about −5.8 eV or more, by differentiating their HOMO energy level by 0.2 eV or more.

The organic light-emitting device of the second example embodiment of the present disclosure as shown in the example of FIG. 6B has a similar structure to the reference examples, except that the green host of the green light-emitting layer has a HOMO energy level of about −5.8 eV, and the red host of the red light-emitting has a HOMO energy level of about −5.6 eV or more, by differentiating their HOMO energy level by 0.2 eV or more. In addition, the blue host of each of the blue light-emitting layer of the first reference examples and the first example embodiment has a HOMO energy level of −6.0 eV.

Further, the first and second example embodiments of the present disclosure have been experimented on by applying a similar structure, except for the light-emitting layers, in the configurations of the above-described reference examples.

In the first example embodiment, the green host of the green light-emitting layer has a HOMO energy level of about −5.8 eV, and the blue hosts of the blue light-emitting layer of the first reference examples and the first example embodiment commonly have a HOMO energy level of −6.0 eV. As shown in Table 1 and the FIG. 7 example, the first example embodiment (Device D) represents almost five times or more of the first reference examples in view of product lifetime. The first example embodiment and the first reference examples show the same or similar results in view of a driving voltage, efficiency, and color purity.

Figure 8:
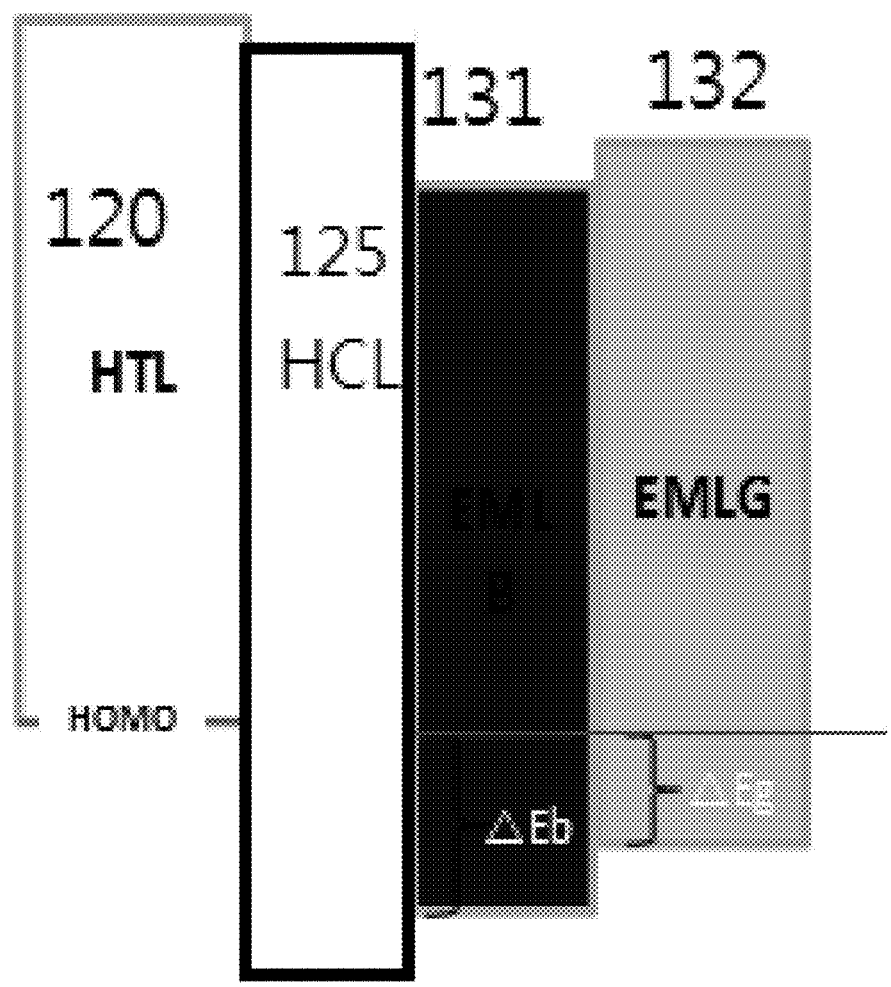
FIG. 8 is a band diagram for three different color light-emitting layers and adjacent common layers according to a fourth example embodiment of the present disclosure.

FIG. 8 is a band diagram for three different color light-emitting layers and adjacent common layers according to a fourth example embodiment of the present disclosure.

Table 2 shows results from the second reference examples E and G and the second embodiment F. These reference examples and the second example embodiment use different red hosts (RH_B, RH_A+RH_B, RH_C), respectively, in the red light-emitting layer. In all devices E, F, and G, the same red dopant of the same content is used. The RH_B, used in the devices E and F, has a HOMO energy level of −5.8 eV and a LUMO energy level of −3.0 eV. The RH_A, used in the device F, has a HOMO energy level of −5.6 eV and a LUMO energy level of −2.8 eV. In the device F, red hosts RH_B and RH_A of two types are used. The RH_C, used in the device G, has a HOMO energy level of −5.85 eV and a LUMO energy level of −3.0 eV.

In the devices E, F, and G, the green host of the green light-emitting layer, which is horizontally adjacent to the red light-emitting layer, has a HOMO energy level of −5.85 eV and a LUMO energy level of −2.9 eV.

TABLE 2

| Device | Structure Embodiment | red host | Voltage (V) | Efficiency_1 (mA/cm$^2$) | Efficiency_2 (Cd/A) | Efficiency_3 (lm/W) | CIE_x | CIE_y | T95 (Hrs.) |
|---|---|---|---|---|---|---|---|---|---|
| E | Second reference example_1 | RH_B | 8.9 | 4.6 | 55.4 | 19.5 | 0.693 | 0.303 | 2000 |
| F | Second embodiment | RH_A + RH_B | 7.3 | 3.0 | 87.0 | 37.2 | 0.693 | 0.304 | 3000 |
| G | Second reference example_2 | RH_C | 10.3 | 10.2 | 24.6 | 7.5 | 0.695 | 0.299 | 1500 |

As shown in the FIG. 8 example and Table 2, the second example embodiment (Device F) represents 1.5 times or more of the second reference examples in view of product lifetime. The second example embodiment has superior results in view of a driving voltage and efficiencies related to luminance (e.g., Cd/A and lm/W) in the above examples.

Figure 9:
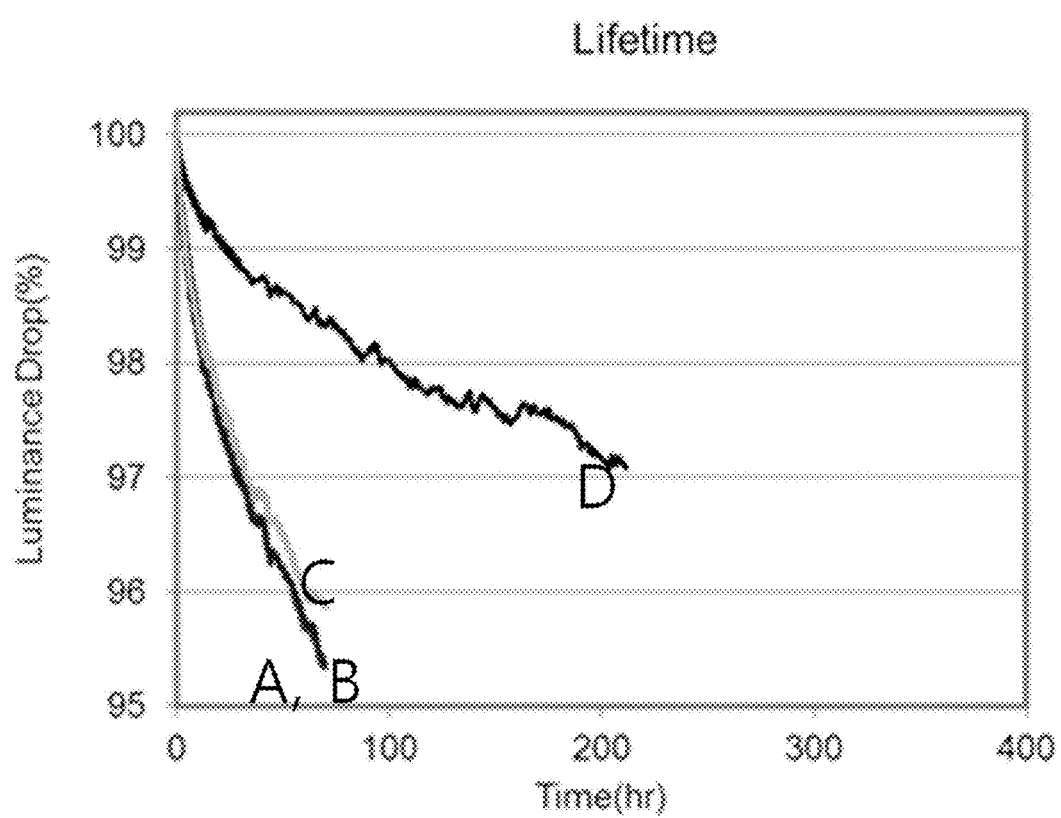
FIG. 9 is a graph illustrating lifetimes for the first reference examples and experimental examples according to the first example embodiment of the present disclosure.

FIG. 9 is a graph illustrating lifetimes for the first reference examples and experimental examples according to the first example embodiment of the present disclosure.

As shown in the FIG. 9 example, in the organic light-emitting device according to a third example embodiment of the present disclosure, the HOMO energy levels of the blue, green, and red light-emitting layers 131, 132, 133 may be lower than an HOMO energy level of hole transport layer 120. The HOMO energy level of the green light-emitting layer 132 may be 0.2 eV higher than the HOMO energy level of the blue light-emitting layer 131 (e.g., |ΔEb−ΔEg|=0.2 eV, where ΔEb is the HOMO difference between the hole transport layer 120 and the blue light-emitting layer 131, and ΔEg is the HOMO difference between the hole transport layer 120 and the green light-emitting layer 132). Further, the HOMO energy level of the red light-emitting layer 133 may be 0.2 eV higher than the HOMO energy level of the green light-emitting layer 132 (e.g., |ΔEg−ΔEr|=0.2 eV, where ΔEr is the HOMO difference between the hole transport layer 120 and the red light-emitting layer 133). The experimental examples according to the third example embodiment have a similar structure as the third reference example with the first and second embodiments, except for the light-emitting layers.

Figure 10:
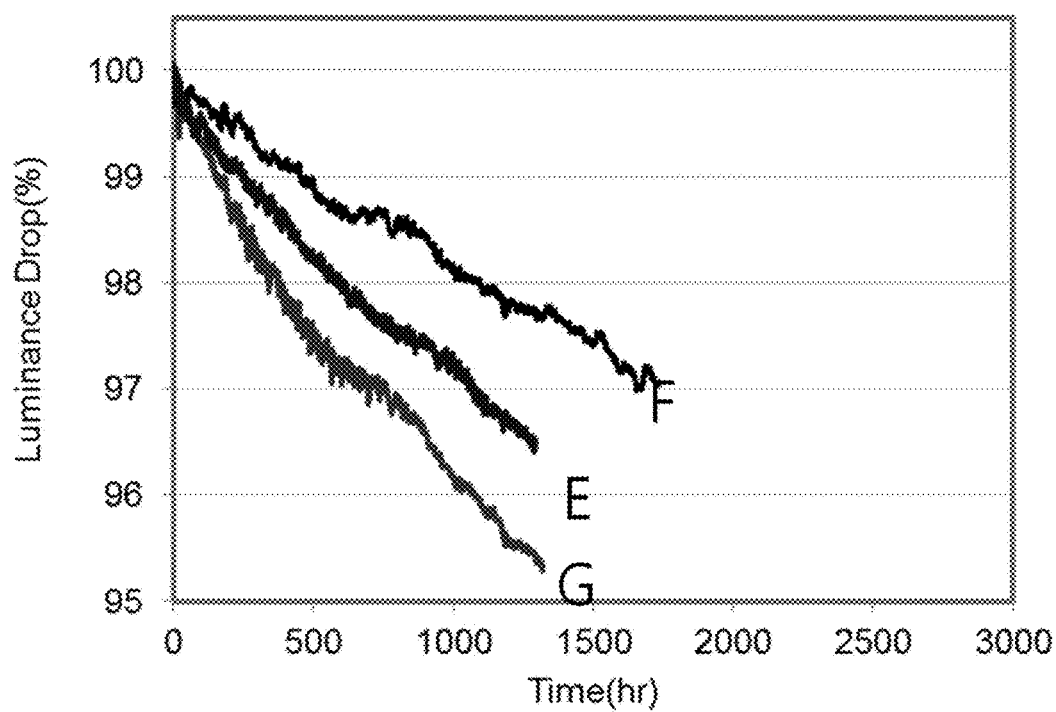
FIG. 10 is a graph illustrating lifetimes for the second reference examples and experimental examples according to the second example embodiment of the present disclosure.

FIG. 10 is a graph illustrating lifetimes for the second reference examples and experimental examples according to the second example embodiment of the present disclosure.

As shown in the example of FIG. 10, the fourth example embodiment of the present disclosure may further include a hole control transport 125 between the hole transport layer 120 and the light-emitting layers 131, 132, as in the FIG. 4 example. The organic light-emitting device of the fourth example embodiment has a similar structure to the first example embodiment, except further providing the hole control layer 125. As shown in the FIG. 10 example, the HOMO energy level of the hole control layer 125 may be lower than the HOMO energy level of the hole transport layer 120 in the fourth example embodiment. In one example, the HOMO energy levels of the hole control layer 125 may be lower than the light-emitting layers 131, 132. In some embodiments, the HOMO energy levels of the hole control layer 125 may be greater than or equal to the HOMO energy level of the light-emitting layers 131, 132 in the FIG. 5C example. However, the HOMO energy level of the hole control layer 125 may be lower than the HOMO energy level of the hole transport layer 120.

The hole control layer 125 may control velocity of hole injection from the hole transport layer 120 to the light-emitting layers 131 and 132. The hole control layer 125 may have a thickness less than 100 Å to reduce or prevent carrier imbalance in the light-emitting layers 131, 132.

In the fourth example embodiment, the blue light-emitting layer 131 and the green light-emitting layer 132 may be in contact with the hole control layer 125. The red light-emitting layer 133 may be also formed in the red sub-pixel as shown in the example of FIG. 9.

Figure 11:
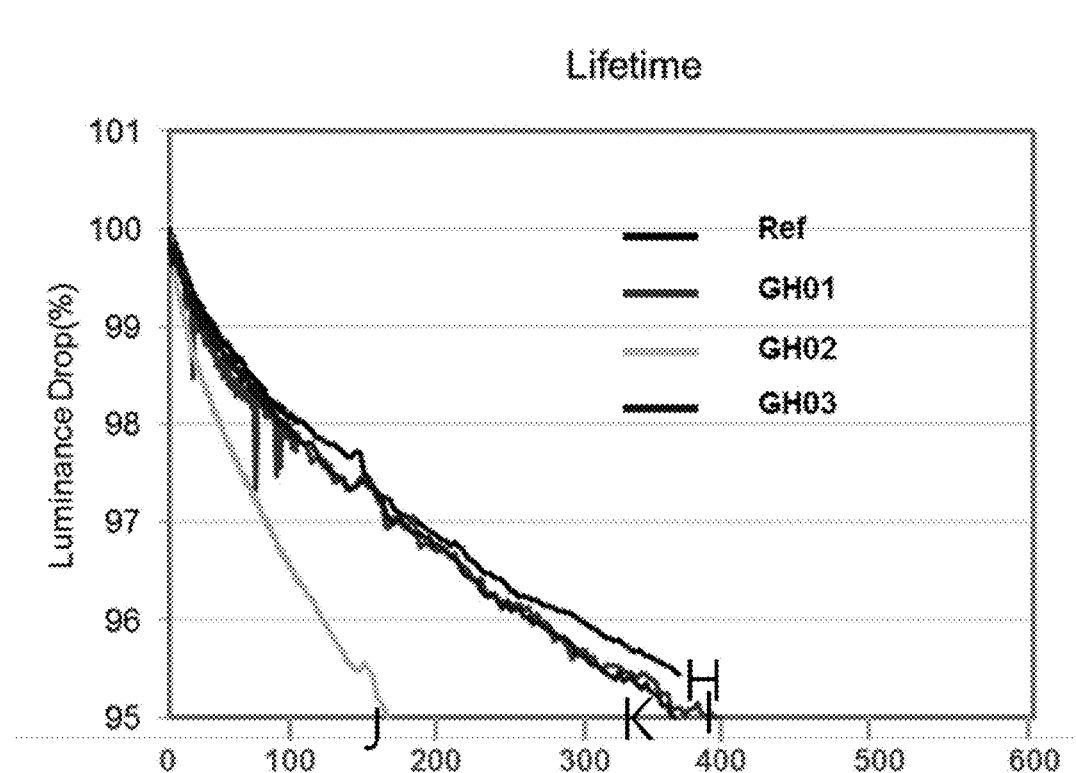
FIG. 11 is a graph illustrating lifetimes for the third reference example and experimental examples according to the fourth example embodiment of the present disclosure.

FIG. 11 is a graph illustrating product lifetimes for the third reference example and experimental examples according to the fourth example embodiment of the present disclosure.

Table 3 shows results from the third reference example of device J and the experimental examples for the fourth embodiments of device H, I, and K. The third reference example and the experimental examples for the fourth example embodiment use different green hosts (ref 3, GH_01, GH_02, GH_03), respectively, in the green light-emitting layer. The third reference example uses the same red host RH_B in the red light-emitting layer that was used in the device E (the second reference example_1). The experimental examples for the fourth example embodiment use the same red host RH_A in the red light-emitting layer that was used in the device F (the second example embodiment). Therefore, the green hosts in the devices H, I, and K have a HOMO energy level of −5.8 eV and a LUMO energy level −2.9 eV and the green host in the device J has a HOMO energy level of −5.9 eV and a LUMO energy level −2.9 eV. The red host RH_A used in the devices H, I, and K has a HOMO energy level of −5.6 eV and a LUMO energy level −2.8 eV. The red host RH_B used in the device J has a HOMO energy level of −5.8 eV and a LUMO energy level −3.0 eV. The blue host of the blue light-emitting layer has a HOMO energy level of about −6.0 eV and a LUMO energy level of −3.0 eV.

TABLE 3

| Device | Structure Green host | Voltage (V) | Efficiency (Cd/A) | Lifetime (T95) (hours) | HOMO (eV) | LUMO (eV) |
|---|---|---|---|---|---|---|
| H | Fourth embodiment_1 | X | 100 | 400 | −5.8 | −2.9 |
| I | Fourth embodiment_2 | X | 101 | 400 | −5.8 | −2.9 |
| J | Third reference example | X + 0.2 | 101 | 170 | −5.9 | −2.9 |
| K | Fourth embodiment_3 | X − 0.4 | 71 | 390 | −5.8 | −2.9 |

As shown in Table 3 and the FIG. 11 example, the fourth embodiment shows a case in which the blue host of the blue light-emitting layer has a HOMO energy difference of 0.2 eV or more with the green host of the green light-emitting layer, and the green host of the green light-emitting layer has a HOMO energy difference of 0.2 eV or more with the red host of the red light-emitting layer.

The fourth example embodiment represents two times the T95 (lifetime to reach 95% luminance of compared to the initial luminance state) of the third reference example. Such result shows that particular HOMO level differences among the light-emitting layers achieve superior product lifetime and efficiency, even in a structure in which a plurality of common layers are provided adjacent to the light-emitting layers.

Figure 12:
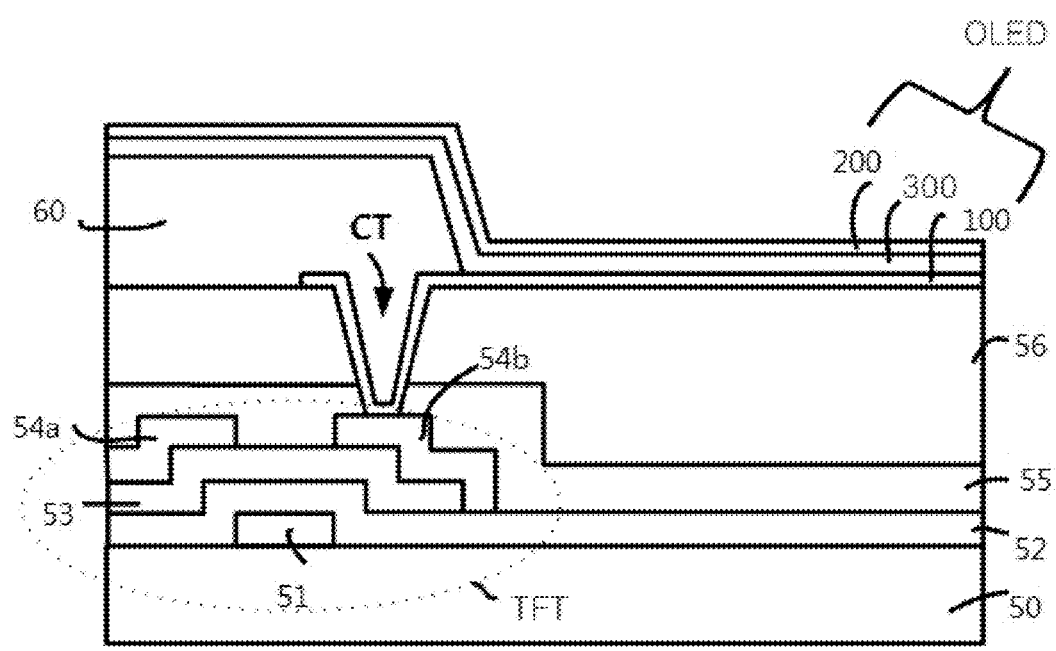
FIG. 12 is a cross-sectional view illustrating an organic light-emitting display device in accordance with an example embodiment of the present disclosure.

FIG. 12 is a cross-sectional view illustrating an organic light-emitting display device according to an example embodiment of the present disclosure.

As shown in the FIG. 12 example, the organic light-emitting display device in accordance with an example embodiment of the present disclosure may include a substrate 50, including a plurality of sub-pixels, thin film transistors (TFTs) of the respective sub-pixels being provided on the substrate 50, and organic light-emitting devices (OLED) including an anode 100 and a cathode 200. For example, one of the anode 100 or the cathode 200 of each organic light-emitting device may be connected to each TFT. Although the FIG. 12 example illustrates one sub-pixel, multiple sub-pixels having a similar configuration may be arranged in a matrix on the substrate 50.

For example, the thin film transistor may include a gate electrode 51 provided in a designated region on the substrate 50, a gate insulating film 52 formed on the substrate 50 to cover the gate electrode 51, a semiconductor layer 53 formed on the gate insulating film 52 to correspond to the gate electrode 51, and a source electrode 54a and a drain electrode 54b formed at respective sides of the semiconductor layer 53. Further, a protective film 55 may be provided to cover the source electrode 54a and the drain electrode 54b, and the anode 100 or the cathode 200 may be connected to the drain electrode 54b via a contact hole CT formed through the protective film 55 to expose at least a part of the drain electrode 54b.

Though the illustrated thin film transistor is illustrated as a bottom gate type, embodiments are not limited thereto, and a top gate type transistor may also be formed. The semiconductor layer 53 may include an amorphous silicon layer, a polysilicon layer, or an oxide semiconductor. The semiconductor layer 53 may include two or more layers of different semiconductor layers.

Meanwhile, if the anode 100 is connected to the drain electrode 54b, the organic stack 1000 may be formed on the anode 100 to include a single stack as in the FIG. 1 example. Alternatively, the organic stack 1000 may be formed on the anode 100 to include two stacked units as in the FIG. 2 example, including the n-type charge generation layer and the p-type charge generation layer, between units (e.g., Unit1, Unit2). Each stack may include a hole transport layer, an light-emitting layer, and an electron transport layer. In some embodiments, a hole injection layer may be formed between the anode and the hole transport layer, and an electron injection layer may be formed between electron transport layer and the cathode. Optionally, the organic stack 1000 may include three or more stacks, as in the example of FIG. 2.

If the cathode 200 is connected to the drain electrode 54b, the organic stack 1000 may be formed in reverse from what was described above. That is, the second unit, the p-type charge generation layer, the n-type charge generation layer, and the first unit may be formed in this order on the anode 100. Each stack may include a hole transport layer, a light-emitting layer, and an electron transport layer. In some embodiments, a hole control layer 125 (see FIG. 4) may be further included between the hole transport layer 120 and the light-emitting layers. Optionally, a hole injection layer may be further included between the anode and the hole transport layer, and/or a hole injection layer may be further included between the electron transport layer and the cathode.

Further, as shown in the FIG. 12 example, a bank 60 may be further included to define an emission region by partially overlapping the anode 100. However, the bank 60 is optional, and may be omitted as desired, and the emission region may be defined through one or more other layers. In some embodiments, the organic stack 1000 and the cathode 200 may be commonly formed over all sub-pixels, and then color filters may be patterned at each sub-pixel.

The above-described organic light-emitting display may achieve color expression by emitting different colors of light through the organic emitting layers of the respective sub-pixels, or may achieve color expression by adding a color filter layer to a light-emitting portion of a common organic emitting layer. Such an organic light-emitting display device including the above-described organic light-emitting device may have the same effects as the above-described organic light-emitting device.

As is apparent from the above description, an organic light-emitting device and an organic light-emitting display device using the same in accordance with an embodiment of the present disclosure have effects as described below. First, embodiments may provide different optical distances by differentiating the thicknesses of the light-emitting layers without adding a common layer for controlling optical distance. That is, an additional mask may not be required for an auxiliary common layer. Secondly, to improve the emission color efficiency, the structure in which the light-emitting layers emitting the same color are provided in different stacks, and the other layers, besides the light-emitting layer for each sub-pixel, are commonly provided for all sub-pixels. That is, even in a plurality of stacked structures, the deposition mask is not increased, increasing a yield is expected, and it is effective to apply to mass production.

Thirdly, for the light-emitting layers having different thicknesses, the HOMO energy relation with the common layer adjacent to the light-emitting layers and the HOMO energy relation among the light-emitting layers are also defined to increase their efficiency and lifetime of the device. In the structure of two or more stacks in the structure including two or more units, including a light-emitting layer in each unit emitting same color, an n-type charge generation layer having stepwise increased n-type dopants may emit light.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An organic light-emitting device, comprising:
a substrate comprising a blue sub-pixel, a green sub-pixel, and a red sub-pixel, each blue sub-pixel, green sub-pixel, and red sub-pixel respectively comprising an anode, a first common layer, a second common layer, and a cathode;

in the blue sub-pixel, a blue light-emitting layer between the first common layer and the second common layer;

in the green sub-pixel, a green light-emitting layer between the first common layer and the second common layer; and in the red sub-pixel, a red light-emitting layer between the first common layer and the second common layer, wherein HOMO energy levels of the blue, green, and red light-emitting layers are each lower than a HOMO energy level of the first common layer, and wherein the HOMO energy level of the green light-emitting layer is 0.2 eV or more higher than the HOMO energy level of the blue light-emitting layer.

2. The organic light-emitting device according to claim 1, wherein the HOMO energy level of the red light-emitting layer is 0.2 eV or more higher than the HOMO energy level of the green light-emitting layer.

3. The organic light-emitting device according to claim 2, wherein:

the red light-emitting layer is thicker than the green light-emitting layer; and the green light-emitting layer is thicker than the blue light-emitting layer.

4. The organic light-emitting device according to claim 1, wherein the first common layer contacts each of the blue light-emitting layer, the green light-emitting layer, and the red light-emitting layer.

5. The organic light-emitting device according to claim 1, further comprising a third common layer between the first common layer and a color-emitting layer that comprises the blue light-emitting layer, the green light-emitting layer, and the red light-emitting layer.

6. The organic light-emitting device according to claim 5, wherein each of the blue light-emitting layer, the green light-emitting layer, and the red light-emitting layer contacts the third common layer.

7. The organic light-emitting device according to claim 6, wherein a HOMO energy level of the third common layer is lower than the HOMO energy level of the first common layer.

8. The organic light-emitting device according to claim 7, wherein the HOMO energy levels of the blue, green, and red light-emitting layers are each lower than the HOMO energy level of the third common layer.

9. The organic light-emitting device according to claim 8, wherein the HOMO energy level of the red light-emitting layer is 0.2 eV or more higher than the HOMO energy level of the green light-emitting layer.

10. The organic light-emitting device according to claim 1, wherein:

a plurality of units are stacked in each sub-pixel; and each of the plurality of units comprises:

the first common layer;

a color-emitting layer comprising at least one of: the blue light-emitting layer, the green light-emitting layer, and the red light-emitting layer; and the second common layer between the anode and the cathode.

11. The organic light-emitting device according to claim 10, further comprising a charge generation layer among the plurality of units.

12. The organic light-emitting device according to claim 11, further comprising, in at least one of the plurality of units, a third common layer between first common layer and the color-emitting layer including the blue light-emitting layer, the green light-emitting layer, and the red light-emitting layer.

13. An organic light-emitting display device, comprising:

a substrate comprising a blue sub-pixel, a green sub-pixel, and a red sub-pixel, each sub-pixel comprising:

a transistor;

a stack in an order of: an anode connected to the transistor, a first common layer, a second common layer, and a cathode;

in the blue sub-pixel, a blue light-emitting layer between the first common layer and the second common layer;

in the green sub-pixel, a green light-emitting layer between the first common layer and the second common layer; and in the red sub-pixel, a red light-emitting layer between the first common layer and the second common layer, wherein HOMO energy levels of the blue, green, and red light-emitting layers are each lower than a HOMO energy level of the first common layer, and wherein the HOMO energy level of the green light-emitting layer is 0.2 eV or more higher than the HOMO energy level of the blue light-emitting layer.

14. The organic light-emitting display device according to claim 13, wherein the HOMO energy level of the red light-emitting layer is 0.2 eV or more higher than the HOMO energy level of the green light-emitting layer.

* * * * *